(12) United States Patent
Yang

(10) Patent No.: US 7,331,810 B2
(45) Date of Patent: Feb. 19, 2008

(54) LOCKING STRUCTURE FOR INTERFACE CARD

(75) Inventor: Tzu-Yi Yang, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/396,074

(22) Filed: Mar. 30, 2006

(65) Prior Publication Data
US 2007/0232122 A1  Oct. 4, 2007

(51) Int. Cl.
*H01R 13/62* (2006.01)
(52) U.S. Cl. .................. 439/327; 439/377; 361/801
(58) Field of Classification Search ........... 439/327, 439/325, 377; 361/740, 755, 801
See application file for complete search history.

(56) References Cited

U.S. PATENT DOCUMENTS 6,299,468 B1 * 10/2001 Lin ............................. 439/327
6,350,143 B2 * 2/2002 Kato et al. ................... 439/374
6,419,499 B1 * 7/2002 Bundza ......................... 439/61
6,669,497 B2 * 12/2003 Westphall et al. ........... 439/325
6,929,490 B2 * 8/2005 Kodera et al. ............... 439/159
7,029,307 B1 * 4/2006 Ling et al. ................... 439/327

\* cited by examiner

*Primary Examiner*—Gary Paumen
(74) *Attorney, Agent, or Firm*—Peter F. Corless; Steven M. Jensen; Edwards Angell Palmer & Dodge LLP

(57) ABSTRACT

A locking structure fixes an interface card having a lateral portion and an end portion to a main board. The locking structure includes a sliding member having a sliding groove for the lateral portion of the interface card to slide along and a containing groove for placement of an elastic member; and the elastic member having a bending rod rotatably installed in the containing groove and a rotating portion protruding to a region outside of the containing groove when the bending rod is disposed in the containing groove. The rotation portion props against the end portion of the interface card when the interface card is in the sliding groove.

11 Claims, 5 Drawing Sheets

US 7,331,810 B2

LOCKING STRUCTURE FOR INTERFACE CARD

FIELD OF THE INVENTION

The present invention relates to locking structures, and, more particularly, to a locking structure for fixing an interface card to a main board.

BACKGROUND OF THE INVENTION

With continuous improvement and development of technology, price for the electronic device has become lower and lower and the electronic devices are become more popular. Most consumers nowadays have and purchase electronic devices, and an electronic device (such as computer and server) comprises many main components, for example, fan, power supply, circuit board, attachment card or interface card are all disposed inside the electronic device, wherein the interface card can be a protocol control information (PCI) long card. The PCI long card is the most commonly seen inner interface card, and because the PCI long card is long in length, a proper locking structure is needed to support the end edge of the PCI long card from shaking thereabouts.

FIG. 1 is a 3-D schematic view illustrating a locking structure for an interface card 11 installed inside an electronic device 1 according to the prior art. The locking structure can be fixed to a main board 13 (shown in FIG. 2A) of the electronic device 1 by plugging a second end 112 of the interface card 11 into the main board 13, and a first end 111 of the interface card 11 into a plastic clamp 12.

FIG. 2A is a 3-D schematic view illustrating that the interface card 11 is fixed to the main board 13 by the plastic clamp 12. The first end 111 of the interface card 11 is opposite to the second end 112. The plastic clamp 12 comprises an elastic member 121, a sliding groove 1211 formed on the elastic member 121, a tipping portion 1212 installed at one end of the sliding groove 1211, and a plastic buckle 1213 installed on the sliding groove 1211 and connected to the tipping portion 1212. The sliding groove 1211 of the plastic clamp 12 is used for guiding the second end 112 of the interface card 11 to be plugged into a socket 131 of the main board 13. After the second end of the interface card 11 is plugged into the socket 131 of the main board 13, the plastic buckle 1213 is fixed to the first end 111 of the interface card 11. When assembling the interface card 11, the tipping portion 1212 linking to the elastic member 121 needs to be removed along the arrow A direction (downwards), and move the interface card 11 along the arrow B direction to plug the second end 112 of the interface card 11 into the socket 131 of the mainboard 13. Then release the tipping portion 1212 to allow the plastic clamp 12 recovering to its original position by elasticity, and the plastic buckle 1213 hooks to the first end 111 of the interface card 11 to complete the locking procedure.

As shown in FIG. 2B, when disengaging the interface card 11 from the plastic clamp 12, remove the tipping portion 1212 linking to the elastic member 121 again along the arrow A direction, and then remove the interface card 11 along the arrow C direction to disengage the interface card 11.

However, the disengagement of the plastic clamp 12 needs to be done by pressing the tipping portion 1212 of the plastic clamp 12, and when the force is applied onto the tipping portion 1212, it also deflects and deforms the elastic member 121. If a permanent deformation occurs on the plastic clamp 12, it can no longer be used to fix the interface card 11, and also if the tipping portion 1212 is used too frequently or is pressed inappropriately, the plastic clamp 12 may break. In addition, if the length between the first and second ends 111, 112 of the interface card is changed, the plastic clamp can no longer be useful.

Furthermore, when assembling or disengaging the interface card 11, one hand needs to press the tipping portion 1212 first to allow the other hand to assemble or disengage, which is a complicate, inconvenient and time-consuming process.

Therefore, how to improve the drawbacks from the prior art such as inconvenient and time-consuming in assembly and disengagement process, and the plastic clamps may be damaged, has become a problem desired to be solved.

SUMMARY OF THE INVENTION

In light of the above drawbacks from the prior art, an objective of the present invention is to provide a locking structure for interface card that is able to fix different lengths interface card.

Another objective of the present invention is to provide a locking structure that is simple in structure.

Yet another objective of the present invention is to provide a locking structure that can save time and labouring.

A further objective of the present invention is to provide a locking structure that is durable for usage.

A further objective of the present invention is to provide a locking structure for interface card that is easy and convenient to assemble and disengage.

In accordance with the above and other objectives, the present invention provides a locking structure comprises a sliding member and at least an elastic member to fix an interface card having a lateral portion and an end portion.

The locking structure includes a sliding member comprising a sliding groove for the lateral portion of the interface card to slide along and a containing groove for placement of an elastic member; and the elastic member having a bending rod rotatably installed in the containing groove and a rotating portion protruding to a region outside of the containing groove when the bending rod is disposed in the containing groove. The rotation portion props against the end portion of the interface card when the interface card is in the sliding groove.

The sliding member mentioned above further has a first opening and a second opening. Preferably, the first and second opening can be constructed in V-shape to guide the interface card into the sliding groove more easily, and the sliding groove can be a concave shape to match to the lateral portion shape of the interface card.

The containing groove is an open groove and can be a L-shape in superficies. Preferably, the cross sectional shape of the containing groove is in U-shape and depth of the containing groove is larger than the diameter of the bending rod, thereby the bending rod can be disposed into the containing groove completely and can be turned adequately.

A first positioning portion and a second positioning portion are disposed on the lateral side of the containing groove and are aligning to the surface of the elastic member. The first and second positioning portions are selected from the group consisting of projecting blocks, semicircular projecting blocks, projecting dots, semicircular projecting dots and other configuration with the same purpose.

The elastic member is one selected from a group consisting of a metal strip, a steel strip, a wire and a spring. The bending rod of the elastic member includes a rod portion and a bending rod end portion formed by bending one end of the rod portion, and the rotating portion is formed by bending the other end of the rod portion to provide grip. Preferably, the rotating portion is in a rectangular shape, but also can be a planiform shape or an elliptic shape.

Compared to the prior art, the elastic member of the present invention of the locking structure can be designed in a variety length flexibly in order to fix the interface card with different length, therefore overcome the drawback of the prior art that the plastic clamp cannot be used anymore when the length of the interface card is changing.

Furthermore, the present invention of the locking structure assembles and disengages the interface card simply by turning the rotating portion. This avoids the inconvenience of the conventional assembly and disengagement of the interface card where one hand is needed to press the tipping portion and then the other hand is used to assemble or disengage the interface card. Therefore, applying the present invention makes the assembly and disengagement process easy and simple, and hence saves time and labouring.

The conventional drawbacks of the plastic clamp cannot apply to different length interface card, assembly and disengagement is inconvenient, time and labour consuming and the clamp is not durable can be solved by applying the present invention of the locking structure, which provides an elastic member that can be designed flexibly to fix different length interface card, therefore it has a high industrial utilization value.

DETAILED DESCRIPTION OF THE PERFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1:
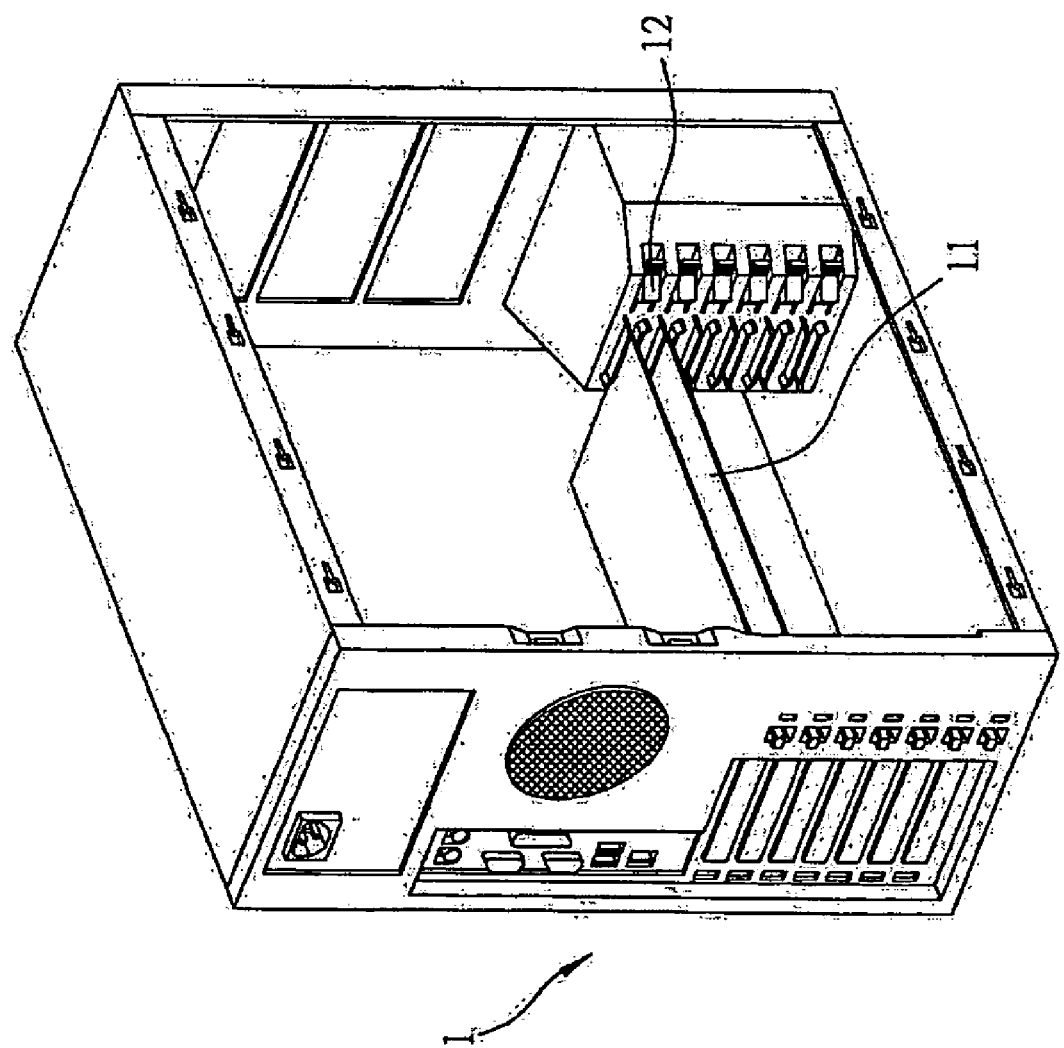
FIG. 1 is a 3-D schematic view illustrating a conventional locking method for an interface card inside an electronic device.
Figure 2A:
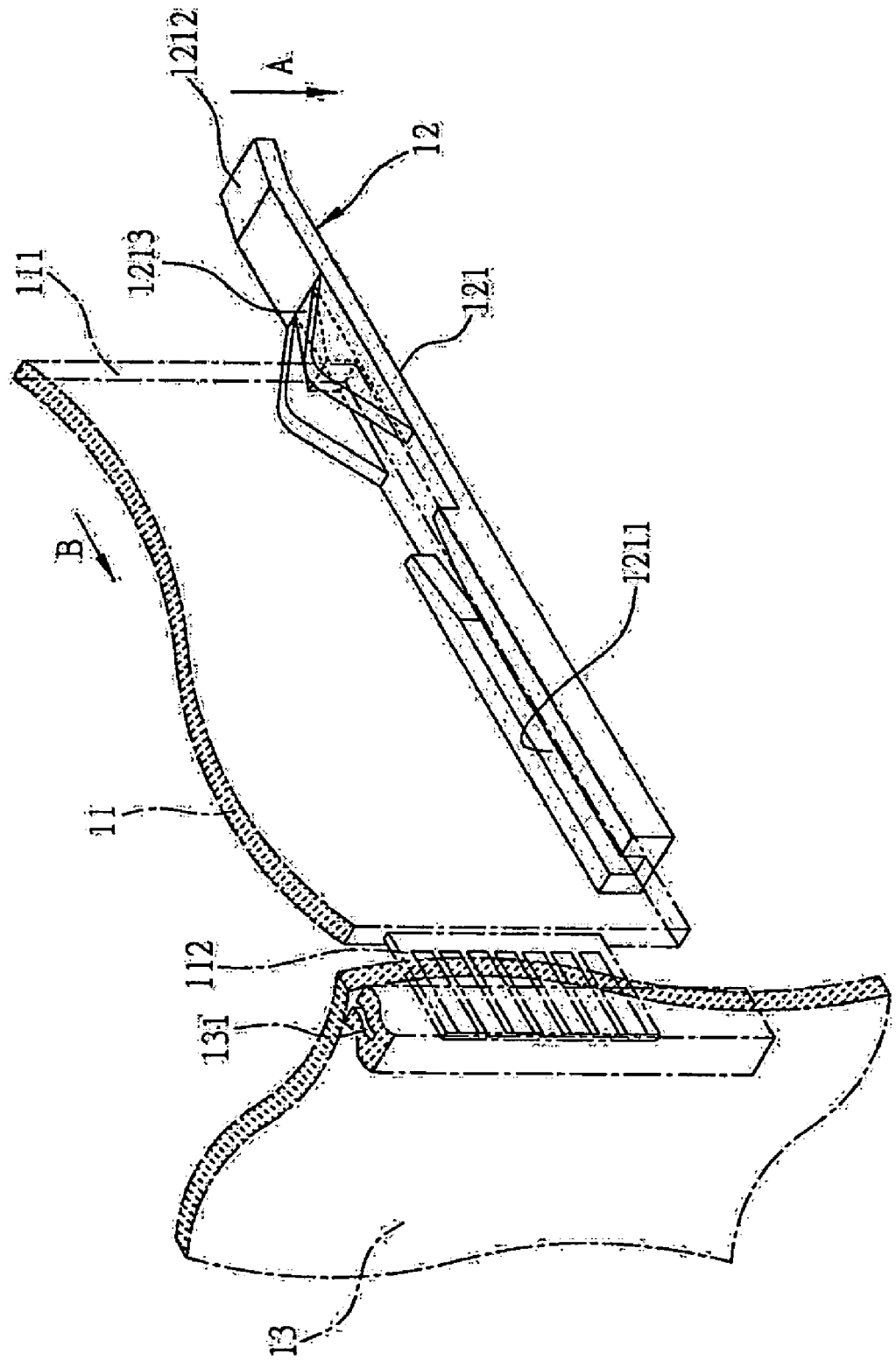
FIG. 2A is a 3-D schematic view illustrating a conventional plastic clamp used to lock the interface card.
Figure 2B:
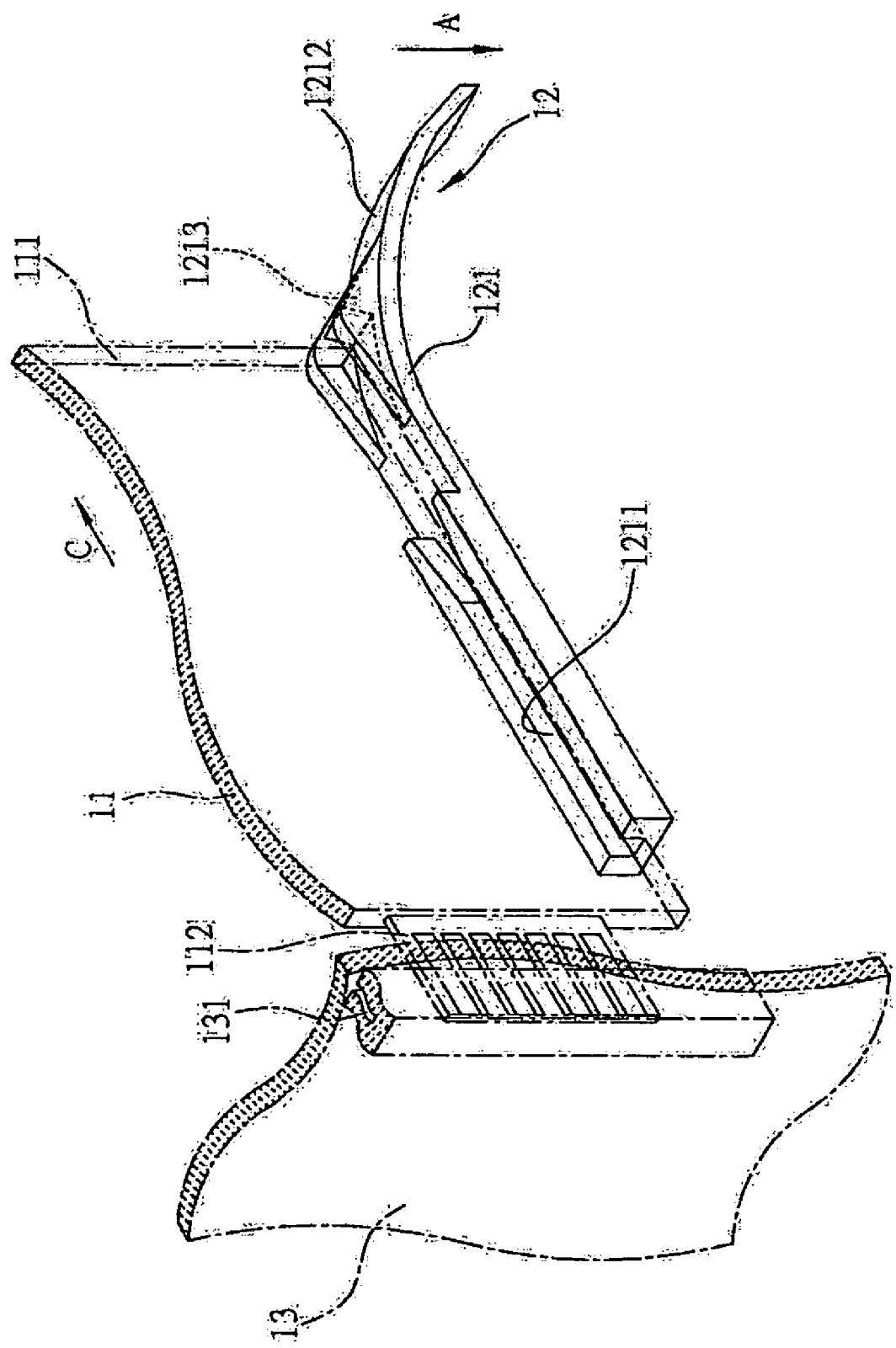
FIG. 2B is a schematic view illustrating the conventional plastic clamp in FIG. 2A when disengaging the interface card.
Figure 3A:
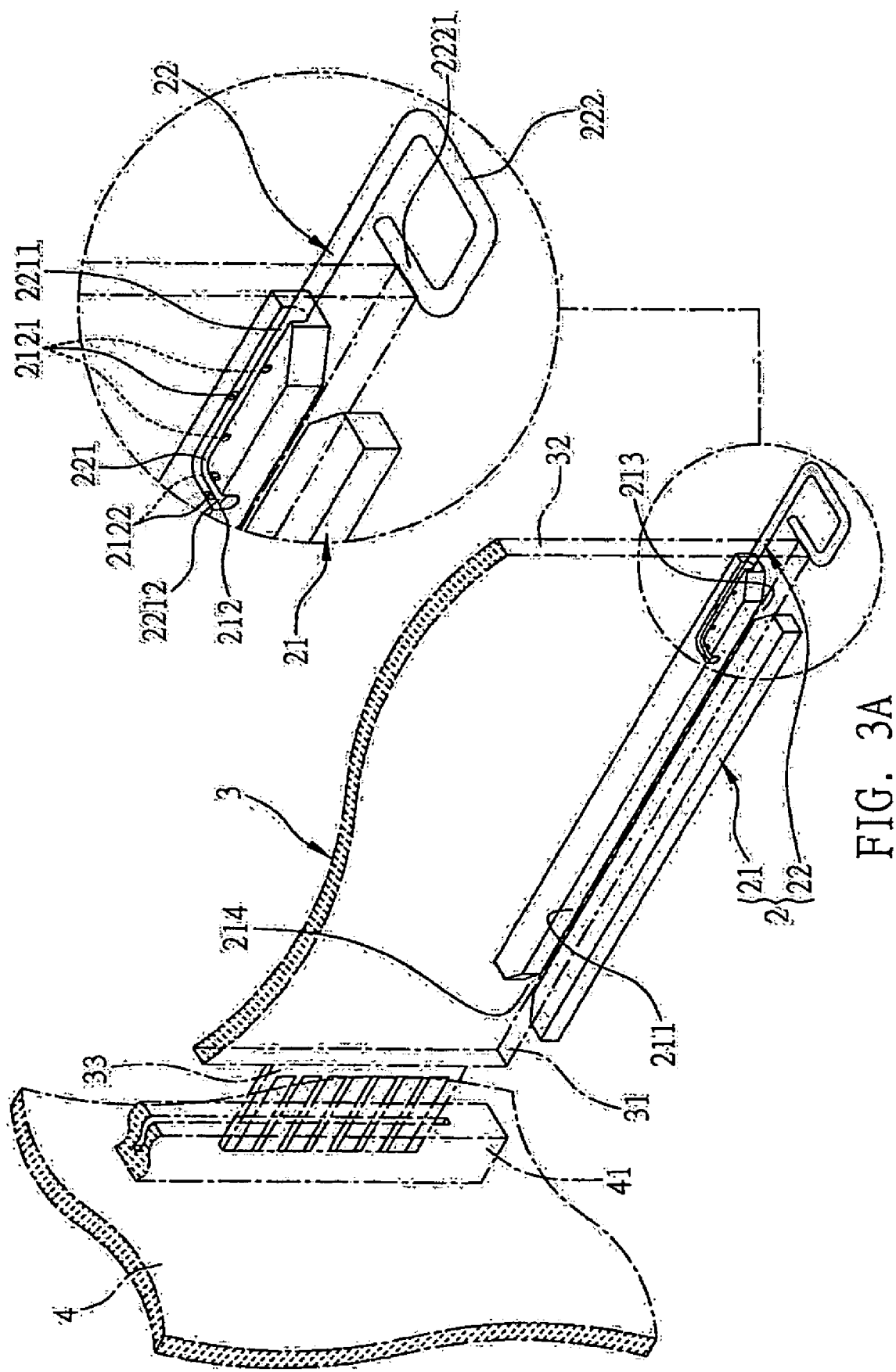
FIG. 3A is a 3-D schematic view illustrating a locking structure of the present invention used to fix the interface card.
Figure 3B:
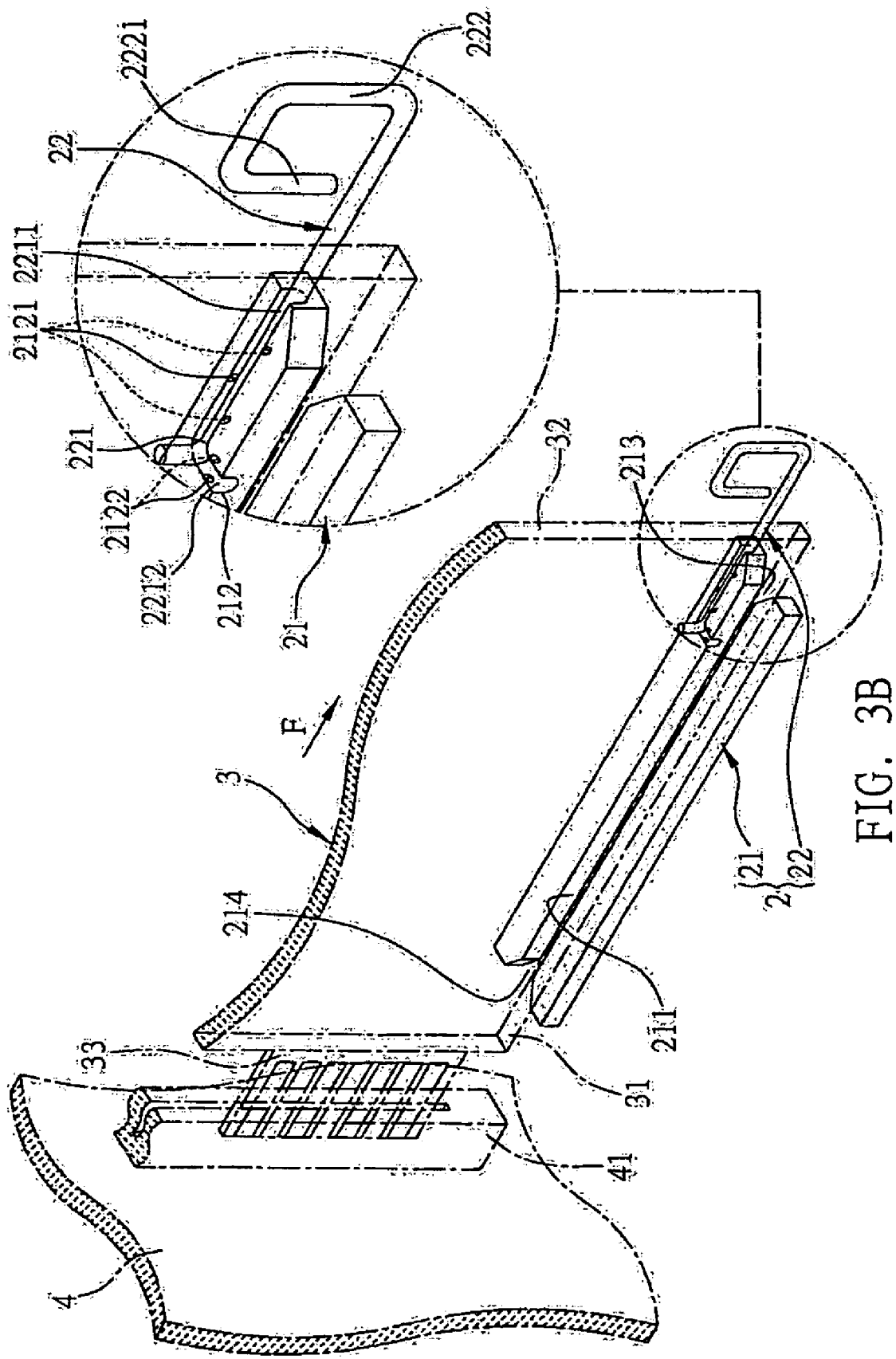
FIG. 3B is a schematic view illustrating the locking structure in FIG. 2A when disengaging the interface card.

FIGS. 3A and 3B are two schematic diagrams of an interface card 3 and a locking structure 2 for fixing the interface card 3 to a main board 4 according to the present invention. The locking structure 2 comprises a sliding member 21 and at least an elastic member 22, both of which are used for fixing the interface card 3, which has a lateral portion 31 and an end portion 32, to the main board 4.

The sliding member 21 comprises a V-shaped first opening 213, a V-shaped second opening 214, a sliding groove 211 for the lateral portion 31 to be slid along, and an L-shaped containing groove 212. The sliding groove 211 has a concave cross section. The containing groove 212 has a U-shaped cross section and a depth larger than a diameter of a bending rod 221 of the elastic member 22, for allowing the bending rod 221 to be disposed in the containing groove 212 completely and rotated freely.

A first positioning portion 2121 and a second positioning portion 2122 are disposed on a lateral side of the containing groove 212 and are aligned to a surface of the elastic member 21. According to the embodiment, both of the first and second positioning portions 2121 and 2122 comprises a plurality of semicircular projecting blocks or semicircular projecting dots.

In addition to the bending rod 221, the elastic member 22 further comprises a rotating portion 222 for positioning the end portion 32. The elastic member 22 is one selected from a group consisting of a metal strip, a steel strip, a wire, a spring and other equivalent structures.

According to the embodiment, the elastic member 22 is a wire. The bending rod 221 comprises a rod portion 2211 and a bending rod end portion 2212 formed by bending one end of the rod portion 2211. The rotating portion 222 of the elastic member 22 is formed by bending the other end of the rod portion 2211. The rotating portion 222 is in the shape of a rectangular, for a hand to grip on easily.

Please note that the shape of the rotating portion 222 can be varied according different needs. For example, the rotation portion 222 can be in the shape of a circle, a planiform or an ellipse. Therefore, the interface card 3 can be fix to or remove from the main board 4 by rotating the rotating portion 222.

The process of the fixture of the interface card 3 to the main board 4 is described as follows. The interface card 3 enters the first opening 213 of the sliding member 21, and then slides along the sliding groove 211 and passes through the second opening 214. Then one end 33 of the interface card 3 is inserted into the slot 41 of the mainboard 4. The rotating portion 222 is then rotated along a direction indicated by arrow E. Therefore the bending rod end portion 2212 of the elastic member 22 presses the second positioning portion 2122 of the containing groove 212, and enters the U-shaped containing groove 212 and to be fixed to the bending rod end portion 2212 by the second positioning portion 2122. So the rotating portion 222 is fixed and cannot rotate, which allows the other end 2221 of the rotating portion 222 to fix the end portion 32 of the interface card 3 to accomplish the locking purpose. Moreover, the elastic member 22 can be replaced with other different lengths elastic member to fix different lengths interface card 3.

The process of the remove of the interface card 3 from the main board 4 is described as follows. Rotate the rotating portion 222 of the elastic member 22 along a direction indicated by arrow D, and the bending rod end portion 2212 of the elastic member 22 will be released from the second positioning portion 2122 and left from the containing groove 212 due to a torque force from the rotating portion 222. At last, move the interface card 3 along a direction indicated by arrow F to remove the interface card 3. Therefore, the assembly and disengaging process are all very convenient, and save time and labor.

According to the description above, the interface cards with varied lengths can be fixed by applying the present invention, and also the present invention is durable, time saving, easy and simple to assemble and disengage. Thus the present invention resolves the conventional drawbacks such as the plastic clamp cannot apply to different lengths interface cards, assembly and disengagement is inconvenient, and time and labour consuming, and therefore it has a high industrial utilization value.

The present invention has been described using exemplary preferred embodiments above, however, it is to be understood that the scope of the present invention is not limited to the disclosed embodiments. On the contrary, it is intended to cover various modifications and similar changes. The scope of the claims, therefore, should be accorded the broadest interpretation so as to encompass all such modifications and similar arrangements.

What is claimed is:

1. A locking structure for fixing an interface card having a lateral portion and an end portion to a main board, the locking structure comprising:
    a sliding member comprising a sliding groove for the lateral portion of the interface card to slide along and a containing groove for placement of an elastic member; and
    the elastic member, which comprises a bending rod rotatably installed in the containing groove and a rotating portion protruding to a region outside of the containing groove, the rotating portion rotated for propping against the end portion of the interface card when the interface card is completely inserted in the sliding groove.

2. The locking structure of claim 1, wherein the sliding member further comprises a first opening from which the interface card is slid along the sliding groove, and a second opening from which the interface card is fixed to the main board.

3. The locking structure of claim 2, wherein the first opening is a V-shaped opening.

4. The locking structure of claim 1, wherein the sliding groove has a concave cross section.

5. The locking structure of claim 1, wherein the containing groove is an L-shaped containing groove.

6. The locking structure of claim 1, wherein the containing groove has a U-shaped cross section.

7. The locking structure of claim 1 further comprising a first positioning portion installed in the containing groove for positioning the bending rod after rotation.

8. The locking structure of claim 7, wherein the first positioning portion is one selected from a group consisting of a projecting block and a projecting dot.

9. The locking structure of claim 1, wherein the elastic member is one selected from a group consisting of a metal strip, a steel strip, a wire and a spring.

10. The locking structure of claim 1, wherein the bending rod of the elastic member comprises a rod portion and a bending rod end portion formed by bending one end of the rod portion, and the rotating portion is formed by bending the other end of the rod portion.

11. The locking structure of claim 1, wherein the rotating portion is in a shape of one selected from a group consisting of a rectangle, a planiform and an ellipse.

* * * * *